United States Patent
Harrod et al.

(10) Patent No.: US 7,743,294 B2
(45) Date of Patent: Jun. 22, 2010

(54) DIAGNOSTIC MODE SWITCHING

(75) Inventors: Peter Logan Harrod, Cambridge (GB); Edmond John Simon Ashfield, Cambridge (GB); Thomas Sean Houlihane, Bassingbourn (GB); Paul Kimelman, Alamo, CA (US); Simon John Craske, Cambridge (GB); Michael John Williams, Ely (GB)

(73) Assignee: ARM Limited, Cambridge (GB)

( * ) Notice: Subject to any disclaimer, the term of this patent is extended or adjusted under 35 U.S.C. 154(b) by 579 days.

(21) Appl. No.: 11/601,849

(22) Filed: Nov. 20, 2006

(65) Prior Publication Data

US 2007/0167785 A1    Jul. 19, 2007

(30) Foreign Application Priority Data

Dec. 23, 2005    (GB) ................... 0526448.6

(51) Int. Cl.
   *G01R 31/28*    (2006.01)
(52) U.S. Cl. ............... 714/724; 714/25; 714/30; 714/34; 714/45; 714/726; 714/727; 714/729; 714/718; 714/733; 714/734; 710/61; 365/201; 703/28
(58) Field of Classification Search ............. None
   See application file for complete search history.

(56) References Cited

U.S. PATENT DOCUMENTS

| | | | |
|---|---|---|---|
| 6,408,415 B1 * | 6/2002 | Kim | 714/738 |
| 6,826,101 B2 * | 11/2004 | Fukuyama | 365/201 |
| 7,013,415 B1 * | 3/2006 | Kamei et al. | 714/729 |
| 7,225,379 B2 * | 5/2007 | Yonaga | 714/744 |
| 7,302,282 B2 * | 11/2007 | McKim et al. | 455/575.1 |
| 7,496,812 B1 * | 2/2009 | Azimi et al. | 714/724 |
| 7,509,250 B2 * | 3/2009 | Cruzado et al. | 703/28 |
| 2002/0046016 A1 * | 4/2002 | Debling | 703/28 |
| 2003/0101395 A1 * | 5/2003 | Man et al. | 714/726 |
| 2006/0212760 A1 * | 9/2006 | Swoboda | 714/38 |
| 2006/0242465 A1 * | 10/2006 | Cruzado et al. | 714/30 |
| 2008/0201503 A1 * | 8/2008 | McKim et al. | 710/61 |

FOREIGN PATENT DOCUMENTS

| | | |
|---|---|---|
| EP | 0 317 014 | 5/1989 |
| GB | 2 379 524 | 3/2003 |
| WO | WO 2004/057357 | 7/2004 |

* cited by examiner

*Primary Examiner*—John P Trimmings
(74) *Attorney, Agent, or Firm*—Nixon & Vanderhye P.C.

(57) ABSTRACT

A system is described having a JTAG diagnostic unit and a serial wire diagnostic unit. A watcher unit is connected to a data connection shared between the diagnostic units. Special patterns detected upon the shared data connection serve to switch between diagnostic modes with respective ones of the diagnostic units becoming active.

31 Claims, 2 Drawing Sheets

DIAGNOSTIC MODE SWITCHING

BACKGROUND OF THE INVENTION

1. Technical Field

The technical field relates to systems having built in diagnostic capabilities, and more particularly, to systems having more than one built in diagnostic mode between which it is desired to switch.

2. Background

It is known to provide apparatus, such as, for example, integrated circuits with built-in diagnostic mechanisms. These diagnostic mechanisms can be used for a variety of different purposes such as, for example, debug, trace, manufacturing test and the like. An example of such built-in diagnostic mechanisms are JTAG serial scan chains used to read and write state within an integrated circuit. As system design develops, the capabilities of built in diagnostic mechanisms also need to develop to keep pace. New diagnostic mechanisms may have greater or preferred functionality over existing diagnostic mechanisms. In this context, there arise situations in which it is necessary or desirable to provide more than one diagnostic mechanism upon a system. An example of such a situation would be a system where it was desired to provide a legacy JTAG diagnostic mechanism in combination with a more modern and capable diagnostic mechanism.

When more than one diagnostic mechanism is provided then this increases the communication requirements to those diagnostic mechanisms. As an example, in the case of an integrated circuit, external pins may be designated to provide diagnostic input and output signals and if more than one diagnostic mechanism is provided then this leads to the requirement for more than one set of such diagnostic input and output pins. However, many modern integrated circuits are pin count constrained and it is disadvantageous to have to dedicate so many input and output pins to diagnostic uses, as such pins are then not available for functional use. One possibility might be to share some of the diagnostic pins and provide a switching pin to which an external signal is applied to switch between the different diagnostic mechanisms inside the integrated circuit. However, the need to dedicate a pin to this switching function is in itself disadvantageous as it consumes a pin which could be used for other purposes.

SUMMARY

An apparatus is provided for processing data comprising:

a first diagnostic unit operable in a first diagnostic mode to communicate diagnostic data with an external diagnostic device in accordance with a first data communication technique;

a second diagnostic unit operable in a second diagnostic mode to communicate diagnostic data with said external diagnostic device in accordance with a second data communication technique;

one or more diagnostic data connections coupled to both said first diagnostic unit and said second diagnostic unit and operable to provide diagnostic data communication between said apparatus and said external diagnostic device; and a watcher unit coupled to at least one of said one or more diagnostic data connections and operable in response to detection of a predetermined signal pattern at said at least one of said one or more diagnostic data connections to switch between said first diagnostic mode and said second diagnostic mode.

The present technique provides a watcher unit which serves to detect a predetermined signal pattern upon one of the diagnostic data connections shared by the different diagnostic mechanisms and use this to trigger a switch between the use of those diagnostic mechanisms. Thus, the diagnostic mechanisms can share at least some of their connections and a dedicated connection for controlling the switching need not be provided. The watcher unit may be provided within one of the diagnostic units itself and need not be provided as a structurally separate entity. The individual diagnostic units could also be separately provided with their own internal watcher unit each sensitive to its predetermined pattern. The switching provided by the watcher unit may or may not be bidirectional. There may be more than two diagnostic units provided.

The diagnostic data connections may overlap in a variety of different ways between the diagnostic mechanisms. In preferred embodiments, one of the diagnostic mechanisms uses all of the diagnostic data connections and another of the diagnostic mechanisms uses a subset of those diagnostic data connections.

The predetermined signal pattern could take a wide variety of different forms and it is possible that a single predetermined signal pattern could be used to switch in either direction between the diagnostic modes. However, in preferred embodiments each direction of switch (where more than one switch direction is provided) or each switch has its own predetermined pattern.

In order to improve the reliability and predictability of the behaviours of the diagnostic mechanisms when switching is allowed between them, particularly when this may be done dynamically, in preferred embodiments the inactive diagnostic mechanism will be held in a predetermined state, preferably reset, when the other of the diagnostic mechanisms is active.

In an analogous manner, the switching is further enhanced in reliability if it is only permitted to take place when the currently active diagnostic mechanism has been placed into reset before the watcher unit is enabled to start to detect the predetermined signal pattern.

Whilst it will be appreciated that the predetermined signal patterns could take a wide variety of different forms, it is particularly preferred that these have a form which is selected such that the currently active diagnostic mechanism will not be triggered to change any state of the device external of that diagnostic mechanism by the predetermined signal pattern. The predetermined signal pattern can thus be made benign with respect to the system (or at least with most embodiments/users). Differing signal patterns for the differing switching directions may be required with each being tailored to be benign with respect to the diagnostic mechanism from which switching is being made. This benign nature also means the predetermined patterns will have no disadvantageous effect when a diagnostic unit to which a switch is being attempted is not actually present within the design.

Whilst it will be appreciated that the diagnostic data could take a wide variety of different forms and be intended for a wide variety of different uses, the present technique is particularly useful in relation to debug data, trace data and manufacturing test data, although this list is not exclusive.

Similarly, it will be appreciated that the present technique could be used with a wide variety of different diagnostic mechanisms, it is particularly well suited to systems in which one of the diagnostic mechanisms is a JTAG diagnostic mechanism and the other is a serial wire protocol diagnostic mechanism (such as ARM serial wire). A predetermined pattern benign to normal JTAG systems is one in which the JTAG state machine is moved through a predetermined sequence of its Test-Logic-Reset (TLR) state, Run-Test/Idle (RTI) state, Select-DR (Sel-DR) state and Select-IR (Sel-IR) state without entering any of the shift state, update state or capture state. Another predetermined pattern benign to most JTAG systems is one in which the JTAG state machine is moved through the IR leg twice and then returned to the reset state. A serial wire protocol benign predetermined pattern may be one corresponding to an invalid data header (i.e. one which doesn't match a predetermined format).

In order to save power, the watcher unit need not be clocked when it is not active to detect the predetermined patterns.

Whilst it will be appreciated that the technology described here is not restricted in its utility to the field of integrated circuits, it is particularly useful in that field.

An apparatus is provided for processing data comprising:

a first diagnostic unit means for communicating diagnostic data in a first diagnostic mode with an external diagnostic device means in accordance with a first data communication technique;

a second diagnostic unit means for communicating diagnostic data in a second diagnostic mode with said external diagnostic device means in accordance with a second data communication technique;

one or more diagnostic data connection means coupled to both said first diagnostic unit means and said second diagnostic unit means for providing diagnostic data communication between said apparatus and said external diagnostic device means; and a watcher unit means coupled to at least one of said one or more diagnostic data connections for switching in response to detection of a predetermined signal pattern at said at least one of said one or more diagnostic data connections between said first diagnostic mode and said second diagnostic mode.

A method is provided for communicating diagnostic data for an apparatus comprising the steps of:

in a first diagnostic mode communicating diagnostic data between a first diagnostic unit and an external diagnostic device in accordance with a first data communication technique;

in a second diagnostic mode communicating diagnostic data between a second diagnostic unit and said external diagnostic device in accordance with a second data communication technique;

coupling one or more diagnostic data connections to both said first diagnostic unit and said second diagnostic unit to provide diagnostic data communication between said apparatus and said external diagnostic device; and using a watcher unit coupled to at least one of said one or more diagnostic data connections and responsive to detection of a predetermined signal pattern at said at least one of said one or more diagnostic data connections to switch between said first diagnostic mode and said second diagnostic mode.

A diagnostic device is provided for connection to an apparatus for processing data, comprising:

one or more diagnostic data connections for coupling to both a first diagnostic unit and a second diagnostic unit within said apparatus for processing data and operable to provide diagnostic data communication between said apparatus for processing data and said diagnostic device; and a signal generator operable to generate a predetermined signal pattern at said at least one of said one or more diagnostic data connections to switch said apparatus for processing data between a first diagnostic mode in which said first diagnostic unit communicates diagnostic data with said diagnostic device in accordance with a first data communication technique and said second diagnostic mode in which said second diagnostic unit communicates diagnostic data with said diagnostic device in accordance with a second data communication technique.

It will be appreciated that a complementary aspect is the external diagnostic device made to interact and appropriately control apparatus for processing data with multiple diagnostic mechanisms built-in. Various aspects mentioned above in relation to the apparatus for data processing itself also reflect in such an external diagnostic device and the signals it generates.

The above, and other objects, features and advantages will be apparent from the following detailed description of illustrative embodiments which is to be read in connection with the accompanying drawings.

DESCRIPTION OF EXAMPLE EMBODIMENTS

Figure 1:
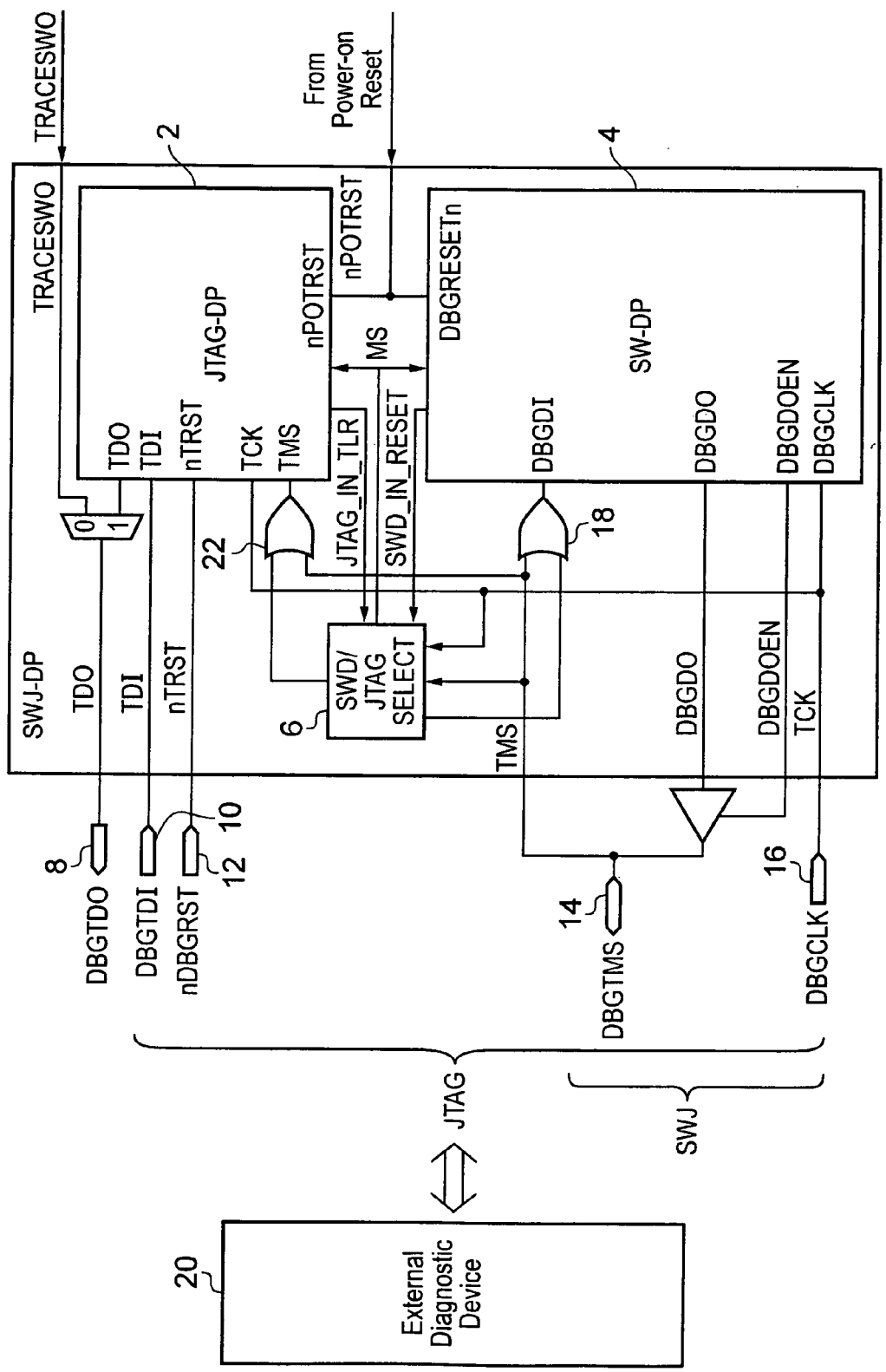
FIG. 1 schematically illustrates a portion of an integrated circuit including multiple diagnostic units and a watcher unit.

FIG. 1 illustrates a debug port supporting both traditional JTAG connections and more modern serial wire protocol connections. In particular, a JTAG diagnostic unit 2 is provided in conjunction with a serial wire diagnostic unit 4. A watcher unit 6 is responsible for controlling switching between a first diagnostic mode in which the JTAG diagnostic unit 2 is active and a second diagnostic mode in which the serial wire diagnostic unit 4 is active. The watcher unit 6 is illustrated as a separate entity, but it will be appreciated that its role could be performed by appropriate circuits within one or both of the diagnostic units 2, 4.

The portion of circuitry illustrated in FIG. 1 will in practice form part of a larger integrated circuit. This larger integrated circuit will contain many more functional blocks upon which the diagnostic operations supported by the elements shown in FIG. 1 will be performed. These further functional blocks which form the remainder of the integrated circuit have not been illustrated in FIG. 1 for the sake of clarity. The JTAG diagnostic unit 2 and the serial wire diagnostic unit 4 support the diagnostic data communication on and off the integrated circuit as well as the control and conduct of the diagnostic operations to be performed upon the remainder of the integrated circuit.

The data connection pins 8, 10, 12, 14, 16 provide communication on and off chip for the diagnostic data. All five of these diagnostic data connections are used by the JTAG diagnostic unit 2 in accordance with the known JTAG communication mechanisms. The data connections 14 and 16 are used by the serial wire diagnostic unit 4. Connection 14 is a bidirectional serial connection for passing data and control and connection 16 is a clock signal for passing a diagnostic clock to be used in conjunction with the serial data by the serial wire diagnostic unit 4.

When the system powers on from reset, the nPOTRST signal serves to render the JTAG diagnostic unit 2 active and the serial wired diagnostic unit 4 inactive, with the serial wired diagnostic unit being held in reset. The watcher unit 6 at this time generates an output signal supplied to OR gate 18 which serves to hold the output of this OR gate 18 high and the serial wire diagnostic unit 4 in reset. The five diagnostic connections 8, 10, 12, 14, 16 are used by the JTAG diagnostic unit 2 in the normal way following a power on reset. Accordingly, legacy external diagnostic devices need not have any serial wire diagnostic capability since the integrated circuit will default into the JTAG mode in which the five data connections will operate in the expected way for the legacy external diagnostic device.

The external diagnostic device 20, which will typically be in the form of a general purpose computer running appropriate software together with an interface unit for providing physical level connectivity to the device under test via the data connections 8, 10, 12, 14, 16. If the external diagnostic device 20 has serial wire capability, then it can switch to serial wire diagnostic mode by first applying appropriate JTAG TMS signals to move the JTAG diagnostic unit 2 into its reset state. This is then signalled by the JTAG diagnostic unit 2 to the watcher unit 6 with the "JTAG_IN_TLR" signal. At this point, the watcher unit 6 becomes active and starts to be clocked. The watcher unit 6 is responsive to further signals received on the TMS data connection 14 and if a predetermined pattern of signals, which corresponds to the JTAG state machine being moved to the IR leg twice and returned to reset, are received, then this triggers a switch to the serial wire diagnostic mode. The JTAG diagnostic unit 2 will have been returned to the reset state at the end of the predetermined signal pattern and will be held in this state whilst the serial wire diagnostic unit 4 is active. The mode select signal MS from the watcher unit 6 is used to activate the serial wire diagnostic unit 4. The signal to one of the inputs of the OR gate 18 being driven by the watcher unit 6 is no longer high and accordingly the OR gate passes the signal received on the data connection 14 through to the serial wire diagnostic unit 4. This allows the serial wire diagnostic unit 4 to be moved out of reset by an appropriate initiating sequence as necessary to establish clock synchronisation, initialisation, or other set up activities.

When the serial wire diagnostic unit 4 has been activated, the JTAG diagnostic unit 2 will be held in reset. The OR gate 22 is used to gate off the serial wire protocol signal from the data connection 14 from reaching the JTAG diagnostic unit 2 since one input to the OR gate 22 is driven high by the watcher unit 6 whilst in the serial wire diagnostic mode. After the switch, the watcher unit 6 returns to being unclocked and not watching for predetermined patterns since the serial wire diagnostic unit 4 will not now remain in reset.

Return from the serial wire diagnostic mode back to the JTAG diagnostic mode can be made in a similar way. First, the serial wire diagnostic unit 4 is moved into a reset state. This asserts the "SWD_IN_RESET" signal supplied to the watcher unit 6 so as to wake up the watcher unit 6 to start to detect a predetermined pattern upon the diagnostic data connection 4. The predetermined pattern being detected in this circumstance is also a sequence corresponding to invalid header data for serial protocol data packets (i.e. not matching a predetermined format). Thus, the invalid header data will be benign to the serial wire diagnostic unit 4 and not cause it to change any state outside of the serial wire diagnostic unit 4. In a similar way, the predetermined pattern which was being watched for by the watcher unit 6 when the JTAG diagnostic unit 2 was active is benign with respect to the JTAG diagnostic unit 2 and will not cause it to change any state external of itself. When the predetermined pattern is detected by the watcher unit 6, then the mode select MS signal is changed to activate the JTAG diagnostic unit 2, block the OR gate 16 and unblock the OR gate 22 so as to move back to the JTAG diagnostic mode. The watcher unit 6 then returns to being unclocked and not detecting the patterns on the diagnostic data connection 14.

Figure 2:
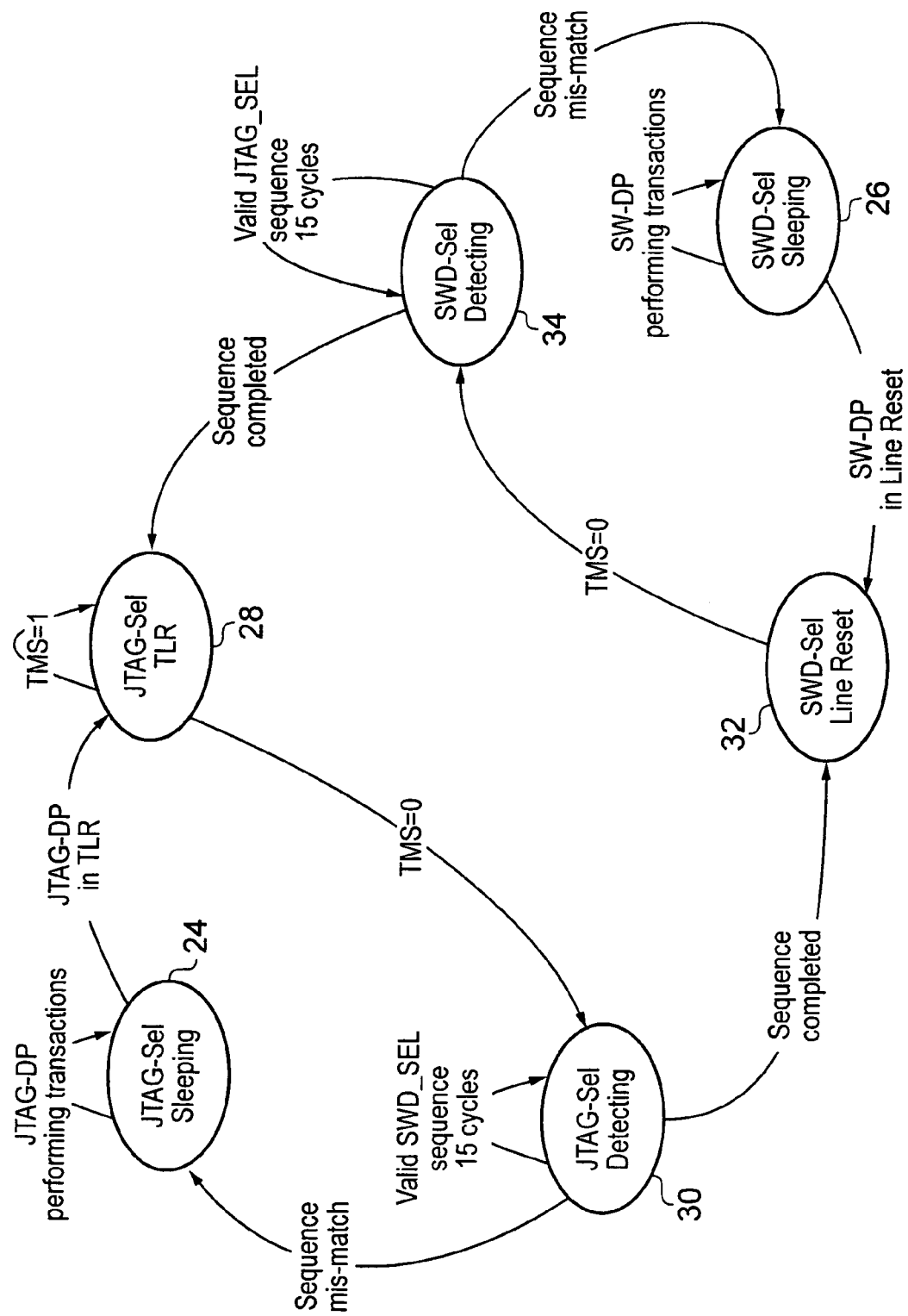
FIG. 2 schematically illustrates the states moved between when controlling switching between the diagnostic modes with the example embodiment of FIG. 1.

FIG. 2 is a state diagram illustrating the states moved between by the system of FIG. 1 as described above. Within the state representing ovals drawn in FIG. 2, the top line indicates which diagnostic mode is currently selected and the bottom line indicates the state or activity being performed. The states 24 and 26 respectively correspond to the JTAG diagnostic unit 2 being active to perform JTAG diagnostic operations and the serial wire diagnostic unit 4 being active to perform serial wire diagnostic actions. When moving from the JTAG diagnostic mode, the system is first moved to state 28 which is the reset state for the JTAG diagnostic unit 2. A transition is then made via the TMS signal being driven low followed by fifteen further characteristic signal levels being driven corresponding to the first predetermined pattern as detected by the watcher unit 6 in state 30. If a sequence match is found, then a transition is made to state 32 at which the serial wire diagnostic unit 4 is selected to become active and in its line reset state. If a sequence mismatch occurs at state 30, then the JTAG diagnostic unit 2 remains selected and a return is made to step 24.

When a successful change has been made to the serial wire diagnostic mode at step 32, then serial wire diagnostic operations at state 26 are reached via a state 34. If a switch back to the JTAG diagnostic mode is required, then the serial wired diagnostic unit 4 is first placed into reset at stage 32 and then the characteristic pattern of data is applied and detected at step 34. If a mismatch occurs, then return is made to step 26, otherwise when the sequence is completed and detected correctly, then the system transfers to state 28 where the JTAG diagnostic mode is selected.

It will be appreciated that the predetermined patterns used to switch between the diagnostic modes could take a variety of different forms. In one example the predetermined pattern is such that changes on TMS transition the JTAG state machine through only its top 4 states, these are Test-Logic-Reset (TLR), Run-Test/Idle (RTI), Select-DR (Sel-DR) and Select-IR (Sel-IR). This avoids any potential complications related to unexpected behaviour in the shift, update or capture states of the TAP controller.

The sequences for JTAG-to-SWD and SWD-to-JTAG switching are both 16-bits and made up combinations of 5-bit and 6-bit loop sequences around the top 4 states, starting from the Test-Logic-Reset (TLR) state. These loop sequences are:

5a: 00111: (TLR)→RTI→RTI→SEL-DR→SEL-IR→TLR
6: 001111: (TLR)→RTI→RTI→SEL-DR→SEL-IR→TLR→TLR
5b: 01111: (TLR)→RTI→SEL-DR→SEL-IR→TLR→TLR

JTAG→SWD Switching Sequence

The JTAG-to-SWD data sequence ensures that a target will switch to using SWD whether it was previously expecting JTAG or SWD. This sequence is such that when fed to a JTAG TAP state machine it causes state transitions that are both sufficiently benign and would not be part of any normal debug or test operation, and also such that when fed to an SW-DP it does not perform any DAP operations with significant side-effects.

The JTAG-to-SWD switching sequence is a 16-bit sequence in the following order 0111100111100111 which may be represented either as 16'h79E7 transmitted MSB first, or as 16'hE79E transmitted LSB first—i.e. pattern 5b followed by 6 followed by 5a.

SWD→JTAG Switching Sequence

Similarly, the SWD-to-JTAG data sequence ensures that a target will switch to using JTAG whether it was previously expecting JTAG or SWD. This sequence is such that when fed to an SW-DP it performs DAP operations that are both sufficiently benign and would not be part of any normal debug operation, and also such that when fed to a JTAG TAP state machine it causes state transitions that are sufficiently benign.

The SWD-to-JTAG sequence is a 16-bit sequence in the following order 0011110011100111 which may be represented either as 16'h3CE7 transmitted MSB first, or as 16'hE73C transmitted LSB first—i.e. pattern 6 followed by 5a followed by 5a.

In another example embodiment the sequence to switch from JTAG diagnostic mode to serial wire diagnostic mode is "0110110110110111" or "0x6DB7". This sequence takes the JTAG controller state machine through the IR leg twice without a shift and then back to the reset state. There are no runs or more than one zero; this gives some protection from entering a shift state even if the sequence is started from an arbitrary point. The recommended switching sequence is to force the JTAG state machine to the reset state before sending the 16-bit sequence and not to start from some arbitrary point. This 16-bit pattern also represents an invalid header within the serial wire diagnostic mode communication mechanism (the parity and stop bits are wrong). This predetermined sequence is benign to most JTAG controller embodiments and uses.

When moving from the serial wire diagnostic mode back to the JTAG diagnostic mode, a special 16-bit "relinquish signal wire debug" pattern wire is sent upon the data connection 14. This pattern is "0111010101110101" or "0x7575". This is an invalid header within the serial wire protocol. This sequence contains no runs or more than one zero (and so cannot reach a shift state); it is also unlikely to be sampled as a valid single wire header as it has the wrong parity stop and mark bits.

The following sequence is recommended for selecting serial wire diagnostic mode from an unknown state:

1. 50 TMS=1 (JTAG-DP was in TLR by $6^{th}$, SW-DP on $50^{th}$).
2. Select SW-DP 16 bits. This would be an error to SW-DP.
3. 50 TMS=1 (in case you were already in SW-DP at 2) to be sure you are in line-reset.
4. ReadID.

The following sequence is recommended for selecting the JTAG diagnostic mode from an unknown state:

1. 50 TMS=1 (if JTAG already, then in TLR. If in SW-DP, then in line-reset now).
2. Release sequence. Will not change registers in TAP.
3. TMS=1 (in case was in JTAG already, gets back to TLR).
4. Set IR-READID, shift out DR to get ID.

Whilst the above has been described in relation to JTAG and serial wire debug data, it will be appreciated that the present techniques may also be applied to trace data and manufacturing test data. Indeed, serial wire trace data may be output via data connection 8 as indicated in FIG. 1 when in the serial wire diagnostic mode.

Although illustrative example embodiments have been described in detail herein with reference to the accompanying drawings, it is to be understood that the claims are not limited to those precise embodiments, and that various changes and modifications can be effected therein by one skilled in the art without departing from the scope and spirit of the appended claims.

We claim:

1. Apparatus for processing data, said apparatus comprising:
   a first diagnostic unit configured in a first diagnostic mode to communicate first diagnostic data with an external diagnostic device in accordance with a first data communication technique;
   a second diagnostic unit configured in a second diagnostic mode to communicate second diagnostic data with said external diagnostic device in accordance with a second data communication technique;
   one or more diagnostic data connections coupled to both said first diagnostic unit and said second diagnostic unit and configured to provide diagnostic data communication between said apparatus and said external diagnostic device; and
   a watcher unit coupled to at least one of said one or more diagnostic data connections and configured in response to detection of a predetermined signal pattern at said at least one of said one or more diagnostic data connections to switch between said first diagnostic mode and said second diagnostic mode,
   wherein said watcher unit is responsive to a first predetermined signal pattern to switch from said first diagnostic mode to said second diagnostic mode and is responsive to a second predetermined signal pattern, different from said first predetermined signal pattern, to switch from said second diagnostic mode to said first diagnostic mode, and
   wherein said first diagnostic unit is a JTAG diagnostic unit and said JTAG diagnostic unit includes a JTAG TAP controller state machine having states corresponding to a Test-Logic-Reset state, a Run-Test/Idle state, a Select-DR state, a Select IR state, a shift state, an update state and a capture state and said first predetermined signal pattern triggers state changes within said JTAG TAP controller state machine that move between said Test-Logic-Reset state, said Run-Test/Idle state, said Select DR state and said Select IR state without entering any of said shift state, said update state and said capture state.

2. The apparatus as claimed in claim 1, wherein said one or more diagnostic data connections comprises a plurality of diagnostic data connections, said first diagnostic unit communicating said first diagnostic data using all of said plurality of diagnostic data connections in said first diagnostic mode.

3. The apparatus as claimed in claim 2, wherein said second diagnostic unit communicates said second diagnostic data using at least one of said plurality of diagnostic data connections in said second diagnostic mode.

4. The apparatus as claimed in claim 1, wherein said watcher unit is responsive to a first predetermined signal pattern to switch from said first diagnostic mode to said second diagnostic mode and is responsive to a second predetermined signal pattern, different from said first predetermined signal pattern, to switch from said second diagnostic mode to said first diagnostic mode.

5. The apparatus as claimed in claim 1, wherein when operating in said first diagnostic mode, said second diagnostic unit is held in a first predetermined state.

6. The apparatus as claimed in claim 5, wherein said first predetermined state is a reset state.

7. The apparatus as claimed in claim 1, wherein when operating in said second diagnostic mode, said first diagnostic unit is held in a second predetermined state.

8. The apparatus as claimed in claim 7, wherein said second predetermined state is a reset state.

9. The apparatus as claimed in claim 1, wherein when operating in said first diagnostic mode, said watcher unit is enabled to start detecting said predetermined signal pattern when said first diagnostic unit is placed into a reset state.

10. The apparatus as claimed in claim 1, wherein when operating in said second diagnostic mode, said watcher unit is enabled to start detecting said predetermined signal pattern when said second diagnostic unit is placed into a reset state.

11. The apparatus as claimed in claim 1, wherein said predetermined pattern is one which does not trigger a currently active one of said first diagnostic unit and said second diagnostic unit to change any state of said apparatus outside said currently active one of said first diagnostic unit and said second diagnostic unit.

12. The apparatus as claimed in claim 1, wherein at least some of said diagnostic data comprises one or more of:
   debug data;
   trace data; and
   manufacturing test data.

13. The apparatus as claimed in claim 1, wherein said first diagnostic unit is a JTAG diagnostic unit.

14. The apparatus as claimed in claim 1, wherein said second diagnostic unit is a serial wire protocol diagnostic unit.

15. The apparatus as claimed in claim 1, wherein said watcher unit is not clocked when not active to detect said predetermined pattern.

16. The apparatus as claimed in claim 1, wherein said apparatus is an integrated circuit and said one or more diagnostic data connections are pin connections of said integrated circuit.

17. Apparatus for processing data, said apparatus comprising:
   a first diagnostic unit configured in a first diagnostic mode to communicate first diagnostic data with an external diagnostic device in accordance with a first data communication technique;
   a second diagnostic unit configured in a second diagnostic mode to communicate second diagnostic data with said external diagnostic device in accordance with a second data communication technique;
   one or more diagnostic data connections coupled to both said first diagnostic unit and said second diagnostic unit and configured to provide diagnostic data communication between said apparatus and said external diagnostic device; and
   a watcher unit coupled to at least one of said one or more diagnostic data connections and configured in response to detection of a predetermined signal pattern at said at least one of said one or more diagnostic data connections to switch between said first diagnostic mode and said second diagnostic mode,
   wherein said watcher unit is responsive to a first predetermined signal pattern to switch from said first diagnostic mode to said second diagnostic mode and is responsive to a second predetermined signal pattern, different from said first predetermined signal pattern, to switch from said second diagnostic mode to said first diagnostic mode, and
   wherein said first diagnostic unit is a JTAG diagnostic unit and said JTAG diagnostic unit includes a JTAG TAP controller state machine having states corresponding to an IR leg for shifting in instruction data and said first predetermined signal pattern triggers state changes within said JTAG TAP controller state machine that move twice through said IR leg without shifting in any instruction data and return to a reset state of said JTAG diagnostic unit.

18. Apparatus for processing data, said apparatus comprising:
   a first diagnostic unit configured in a first diagnostic mode to communicate first diagnostic data with an external diagnostic device in accordance with a first data communication technique;
   a second diagnostic unit configured in a second diagnostic mode to communicate second diagnostic data with said external diagnostic device in accordance with a second data communication technique;
   one or more diagnostic data connections coupled to both said first diagnostic unit and said second diagnostic unit and configured to provide diagnostic data communication between said apparatus and said external diagnostic device; and
   a watcher unit coupled to at least one of said one or more diagnostic data connections and configured in response to detection of a predetermined signal pattern at said at least one of said one or more diagnostic data connections to switch between said first diagnostic mode and said second diagnostic mode,
   wherein said watcher unit is responsive to a first predetermined signal pattern to switch from said first diagnostic mode to said second diagnostic mode and is responsive to a second predetermined signal pattern, different from said first predetermined signal pattern, to switch from said second diagnostic mode to said first diagnostic mode, and
   wherein said second diagnostic unit is a serial wire protocol diagnostic unit and said serial wire protocol diagnostic unit communicates using packets of data each including a data header and said second predetermined signal pattern corresponds to an invalid data header.

19. A diagnostic device for connection to an apparatus for processing data, said diagnostic device comprising:
   one or more diagnostic data connections for coupling to both a first diagnostic unit and a second diagnostic unit within said apparatus for processing data and configured to provide diagnostic data communication between said apparatus for processing data and said diagnostic device; and
   a signal generator configured to generate a predetermined signal pattern at said at least one of said one or more diagnostic data connections to switch said apparatus for processing data between a first diagnostic mode in which said first diagnostic unit communicates diagnostic data with said diagnostic device in accordance with a first data communication technique and said second diagnostic mode in which said second diagnostic unit communicates diagnostic data with said diagnostic device in accordance with a second data communication technique,
   wherein said signal generator is configured to generate a first predetermined signal pattern to switch said apparatus for processing data from said first diagnostic mode to said second diagnostic mode and generate a second predetermined signal pattern, different from said first predetermined signal pattern, to switch said apparatus for processing data from said second diagnostic mode to said first diagnostic mode, and
   wherein said first diagnostic unit is a JTAG diagnostic unit and said JTAG diagnostic unit includes a JTAG TAP controller state machine having states corresponding to a Test-Logic-Reset state, a Run-Test/Idle state, a Select DR state, a Select IR state, a shift state, an update state and a capture state and said first predetermined signal pattern triggers state changes within said JTAG TAP controller state machine that move between said Test-Logic-Reset state, said Run-Test/Idle state, said Select DR state and said Select IR state without entering any of said shift state, said update state and said capture state.

20. The diagnostic device as claimed in claim 19, wherein said one or more diagnostic data connections comprises a plurality of diagnostic data connections, said first diagnostic unit communicating said diagnostic data using all of said plurality of diagnostic data connections in said diagnostic mode.

21. The diagnostic device as claimed in claim 20, wherein said second diagnostic unit communicates said second diagnostic data using at least one of said plurality of diagnostic data connections in said second diagnostic mode.

22. The diagnostic device as claimed in claim 19, wherein said signal generator is configured to generate a first predetermined signal pattern to switch said apparatus for processing data from said first diagnostic mode to said second diagnostic mode and generate a second predetermined signal pattern, different from said first predetermined signal pattern, to switch said apparatus for processing data from said second diagnostic mode to said first diagnostic mode.

23. The diagnostic device as claimed in claim 19, wherein, when said apparatus for processing data is operating in said first diagnostic mode, said signal generator is configured to generate signals to place said first diagnostic unit into a reset state before generating said predetermined signal pattern.

24. The diagnostic device as claimed in claim 19, wherein, when said apparatus for processing data is operating in said second diagnostic mode, said signal generator is configured to generate signals to place said second diagnostic unit into a reset state before generating said predetermined signal pattern.

25. The diagnostic device as claimed in claim 19, wherein said predetermined signal pattern is one which does not trigger a currently active one of said first diagnostic unit and said second diagnostic unit to change any state of said apparatus for processing data outside said currently active one of said first diagnostic unit and said second diagnostic unit.

26. The diagnostic device as claimed in claim 19, wherein at least some of said diagnostic data comprises one or more of:
debug data;
trace data; and
manufacturing test data.

27. The diagnostic device as claimed in claim 19, wherein said first diagnostic unit is a JTAG diagnostic unit.

28. The diagnostic device as claimed in claim 19, wherein said second diagnostic unit is a serial wire protocol diagnostic unit.

29. The diagnostic device as claimed in claim 19, wherein said apparatus for processing data is an integrated circuit and said one or more diagnostic data connections are pin connections of said integrated circuit.

30. A diagnostic device for connection to an apparatus for processing data, said diagnostic device comprising:
one or more diagnostic data connections for coupling to both a first diagnostic unit and a second diagnostic unit within said apparatus for processing data and configured to provide diagnostic data communication between said apparatus for processing data and said diagnostic device; and
a signal generator configured to generate a predetermined signal pattern at said at least one of said one or more diagnostic data connections to switch said apparatus for processing data between a first diagnostic mode in which said first diagnostic unit communicates diagnostic data with said diagnostic device in accordance with a first data communication technique and said second diagnostic mode in which said second diagnostic unit communicates diagnostic data with said diagnostic device in accordance with a second data communication technique,
wherein said signal generator is configured to generate a first predetermined signal pattern to switch said apparatus for processing data from said first diagnostic mode to said second diagnostic mode and generate a second predetermined signal pattern, different from said first predetermined signal pattern, to switch said apparatus for processing data from said second diagnostic mode to said first diagnostic mode, and
wherein said first diagnostic unit is a JTAG diagnostic unit and said JTAG diagnostic unit includes a JTAG TAP controller state machine having states corresponding to an IR leg for shifting in instruction data and said first predetermined signal pattern triggers state changes within said JTAG TAP controller state machine that move twice through said IR leg without shifting in any instruction data and return to a reset state of said JTAG diagnostic unit.

31. A diagnostic device for connection to an apparatus for processing data, said diagnostic device comprising:
one or more diagnostic data connections for coupling to both a first diagnostic unit and a second diagnostic unit within said apparatus for processing data and configured to provide diagnostic data communication between said apparatus for processing data and said diagnostic device; and
a signal generator configured to generate a predetermined signal pattern at said at least one of said one or more diagnostic data connections to switch said apparatus for processing data between a first diagnostic mode in which said first diagnostic unit communicates diagnostic data with said diagnostic device in accordance with a first data communication technique and said second diagnostic mode in which said second diagnostic unit communicates diagnostic data with said diagnostic device in accordance with a second data communication technique,
wherein said signal generator is configured to generate a first predetermined signal pattern to switch said apparatus for processing data from said first diagnostic mode to said second diagnostic mode and generate a second predetermined signal pattern, different from said first predetermined signal pattern, to switch said apparatus for processing data from said second diagnostic mode to said first diagnostic mode, and
wherein said second diagnostic unit is a serial wire protocol diagnostic unit and said serial wire protocol diagnostic unit communicates using packets of data each including a data header and said second predetermined signal pattern corresponds to an invalid data header.

* * * * *